(12) United States Patent
Gutierrez

(10) Patent No.: US 6,573,793 B1
(45) Date of Patent: Jun. 3, 2003

(54) REFLECT FORWARD ADAPTIVE LINEARIZER AMPLIFIER

(76) Inventor: Romulo Gutierrez, 120 Cherryville Hollow Rd., Flemington, NJ (US) 08822

( * ) Notice: Subject to any disclaimer, the term of this patent is extended or adjusted under 35 U.S.C. 154(b) by 0 days.

(21) Appl. No.: 10/120,063

(22) Filed: Apr. 10, 2002

(51) Int. Cl.$^7$ ................................. H03F 1/00
(52) U.S. Cl. ........................ 330/151; 330/149
(58) Field of Search ................. 330/149, 151

(56) References Cited

U.S. PATENT DOCUMENTS

| | | |
|---|---|---|
| 5,146,177 A | 9/1992 | Katz et al. |
| 6,111,462 A | 8/2000 | Mucenickz et al. |
| 6,127,889 A * | 10/2000 | Myer ........................ 330/149 |
| 6,133,791 A * | 10/2000 | Horiguchi et al. .......... 330/151 |
| 6,163,213 A * | 12/2000 | Vaktnas ...................... 330/149 |
| 6,326,843 B1 | 12/2001 | Nygreen et al. |

FOREIGN PATENT DOCUMENTS

EP    762 630 A1    12/1997

* cited by examiner

*Primary Examiner*—Henry Choe

(57) ABSTRACT

The Reflect Forward Adaptive Linearizer Amplifier (RFAL Amplifier) assembly (15) in FIG. 1 provides a linerizing method that uses the input reflected signal of the Main 1 Amplifier (23) to develop an intermodulation-correcting signal. The invention incorporates a directional coupler at the input of the Main 1 amplifier that samples and sums the input reflected signal from the Main 1 Amplifier and the forward fundamental input signal to form a distortion-correcting signal that contains both the fundamental and the distortion products of the output. By proper delay and amplification of this correcting signal, it can then be used to drive another Main amplifier (35) to both cancel the output distortion products and double the output power of the Main 1 Amplifier with significant improvement of the overall linearity and efficiency of the final amplifier assembly. The technique allows the use of lower cost transistor up to the Pout at the 1-dB Gain Compression Point with significant distortion cancellation.

4 Claims, 4 Drawing Sheets

REFLECT FORWARD ADAPTIVE LINEARIZER AMPLIFIER

REFERENCE CITED

U.S. Patent Documents

| | | |
|---|---|---|
| 5,146,177 | Sep. 8, 1992 | Katz, et al. |
| 6,111,462 | Aug. 29, 2000 | Mucenieks, et al. |
| 6,326,843 | Dec. 4, 2000 | Nygren, et al. |

European Patent Office

| | | |
|---|---|---|
| EP 0 762 630 A1 | Dec. 3, 1997 | Lisco, Richard J. et al. |

Other Reference

Book entitled: Feedforward Linear Power Amplifiers. Nick Pothecary. Artech House, 1999. Pages 124–192

BACKGROUND—Field of Invention

This invention relates to a multi-tone, high frequency, and high power linearizer amplifier with low intermodulation distortion. Similar type of amplifiers uses predistortion or feedforward circuits or a combination of both. These amplifiers are typically used in wireless telecommunications applications and can be used in other applications requiring a high level of linearity including fiber optic and military systems.

BACKGROUND—Description of Prior Art

When amplifiers are used at their high power range of their capability they become non-linear. Non-linear operation results in distortion of the input signal at the output of an amplifier. Distortion products that fall in adjacent active channels cause unwanted interference. New wireless communication signals have high peak-to-average ratio causing amplifiers to temporarily operate in their non-linear region and cause distortion affecting adjacent communication channels. Predistortion and feedforward amplifiers are used to "linearize" or reduce the distortions from amplifiers used in applications requiring closely spaced channels at high power levels.

The prior art techniques like predistortion uses independently created distortion products ahead of the amplifier. Feedforward uses a sample of the output signal from the non-linear device to achieve a means of linearization of the distortion products.

Predistortion Amplifiers

Figure 2:
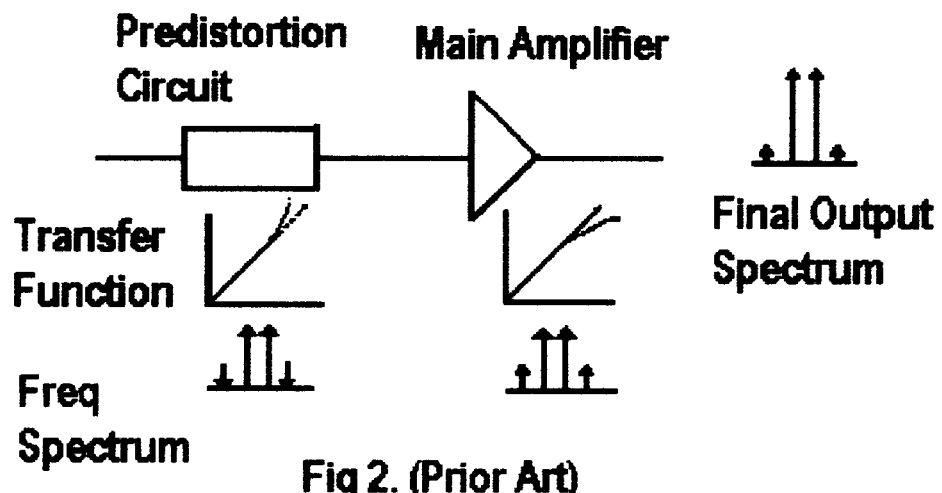

The basic concept shown in FIG. 2 is to create a circuit that has output signal characteristics that are inversely proportional to the amplifier that it drives, so that at the point that the main amplifier transfer curve deviates from linear, the predistorter driver transfer curve is opposite, to maintain the desired output linearity. Also, the predistorter drives the amplifier so that the intermodulation products are canceled at its output by generating similar $3^{rd}$ order intermodulation products as those created by the amplifier but in anti-phase.

Because of the difficulty in creating the right transfer characteristic over all input conditions a predistorter only provides cancellation of $3^{rd}$ order products and are limited to the narrow maximum input level range of the amplifier. Predistorters also reduce the gain of the overall amplifier by the amount of loss of the predistorter circuit. Adaptive predistorter techniques are also used to compensate for aging and temperature, using a sample the output signal to adjust the pre-distorting transfer characteristics over temperature time etc. These use memory-based circuitry or base band frequency control and are usually narrower band and much more complex than non-adaptive types.

Feedforward Amplifiers

Figure 3:
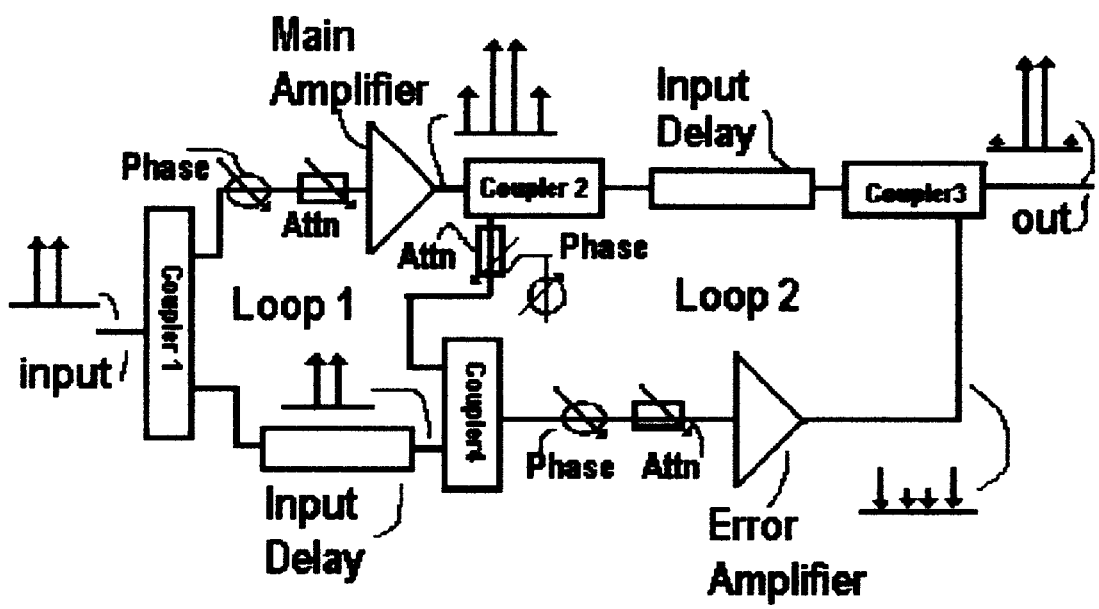

The basic concept shown in FIG. 3 is to create a stable, delayed flow of the signals to improve the linearity of the main amplifier. Two loops are used. The first loop generates the error signal consisting ideally of the distortion products and the second uses the error signal to insert it back into the output signal flow and cancel the distortion out of the main amplifier.

First Loop: The input signal is split at the input coupler C1. One path goes to the main amplifier and the other is delayed and fed to a summing network at coupler C4. The output signal of the amplifier is sampled at the output of the Main Amplifier on coupler C2, and fed to the summing network at coupler C4. By proper delay and level control, the fundamental input signal is suppressed and the distortion signals remain. This left over signal called "error signal" is then used in the second loop.

Second Loop: The error and fundamental residue signal from the first loop is amplified and feeds into the coupled port of the output coupler C3 with the intermod products at a level and phase that causes the Main Amplifier's output non-linearity to cancel. The output of the main amplifier containing the amplified input signal and the non-linearity is delayed to meet the error-correcting signal at the output coupler C3 at the exact time to form a continuous signal flow without feedback.

In actual practice is impossible to maintain a perfect balance over a range of frequencies and operating conditions such as input drive, temperature, and tolerances of components. The loops have to be balanced to a very high degree of precision (normally <0.5 dB amplitude and <5 degree of phase) required for high distortion cancellation. When the feedforward amplifier is not balanced, some of the fundamental output signal will not cancel completely and feeds thru to the second loop of the feedforward linearizer. This signal is amplified by the error amplifier and gets back into the main output at C4. Depending on the phase and level it adds or subtract from the main signal. If the level is high enough to drive the Error Amplifier into its non-linear condition, the intermodulation products of the Error Amplifier feeds into the output at C3 causing the system to become non-linear again. The error amplifier, therefore, has to be properly sized to be capable of handling these unwanted signals so as to maintain the desired level of linearity over the full frequency range and input levels. This problem results in a lower level of efficiency.

A significant deficiency of the feedforward configuration occurs when the Main Amplifier is used above the point where gain compression starts. At this point the first loop becomes un-balanced. The un-balance causes the level of the error signal to increase significantly driving the error amplifier to become non-linear and feed new distortion back into the output.

U.S. Pat. No. 6,111,462, and the simpler European Patent Application EP 0 762 630 A1 describes feedforward configurations that provide both cancellation and higher power by using "parallel main power amplifiers" and a properly delayed sample of the output intermodulation products and the reference fundamental input signal. The attenuator connected to coupler C2 can replaced with a phase shifter. It creates an error with the proper phase and amplitude so that it can be amplified with a high power amplifier in the error path and then combined with the proper amplitude and phase at the output to achieve higher power with cancellation. See FIG. 3. These methods improve on the efficiency disadvantages of the classical feedforward linearizer. The referenced patents also have similar difficulties as the standard configuration when the signal levels crossover to the gain compression region of the Main amplifier thereby causing $1^{st}$ loop imbalance and injection of intermodulation products into the output.

The use of predistortion with feedforward techniques is needed to operate above the gain compression point area of the main amplifier but at a much added circuit complexity.

SUMMARY

In accordance with the present invention a linearizing method that uses of a fraction of the reflected input signal of an amplifier by means of a distortion-correcting path for the purpose of reducing the output distortion products created by said amplifier. The delayed output signal of said amplifier and the output signal of said distortion correcting path are combined to provide significant distortion reduction and increased fundamental power at the output port of said combiner.

OBJECTS AND ADVANTAGES

The Reflect-Forward Adaptive Linearizer Amplifier (RFAL Amplifier) invention has the following improvements over prior art:

a. The "RFAL" Amplifier provides substantial linear operation improvement when operating with power levels up to the 1 dB gain compression point of the Main Amplifier in FIG. 1.

b. Input overloading characteristics are significantly better than those encountered in FIG. 3 feedforward configurations. Also provides higher peak-to-average power ratio operation.

c. The RFAL Amplifier uses a lower number of couplers and shorter delay lines resulting in lower circuit losses and simplicity. The improvement in operational linearity at a higher power level allows the use of lower power output capability, and more economical semiconductors to attain the same level of performance that prior art configurations provide.

d. The distortion-correcting path can be aligned independently from the fundamental path both in amplitude and phase. No output error signal or output sampling coupler is used. Results in lower losses and makes it easier to align for optimum distortion cancellation, output power, and gain flatness. The RFAL Amplifier uses three basic independently adjusted paths that begin at the input of the assembly and combine at the output of the assembly. These paths are:
A) Main 1 Amplifier path.
B) Reflected Distortion-Cancellation path
C) Forward path.
(Paths C and B travel through the same Booster and Main 2 Amplifier.)

e. Three identical amplifiers can be used to double the output power of the Main Amplifier with significant intermodulation distortion cancellation features and provides improved gain and temperature tracking. Also simpler manufacture, temperature and aging compensation can be realized by using the same amplifiers.

f. The signals all flow in a forward direction, with similar arrival time at output, achieving the cancellation of intermod products with maximum output power.

g. The RFAL Amplifier provides real-time adaptive linearization performance with any number of signals and modulation schemes.

Further objects and advantages of my invention will become apparent from a consideration of the drawings and ensuing description.

DRAWING FIGURES

Figure 1:
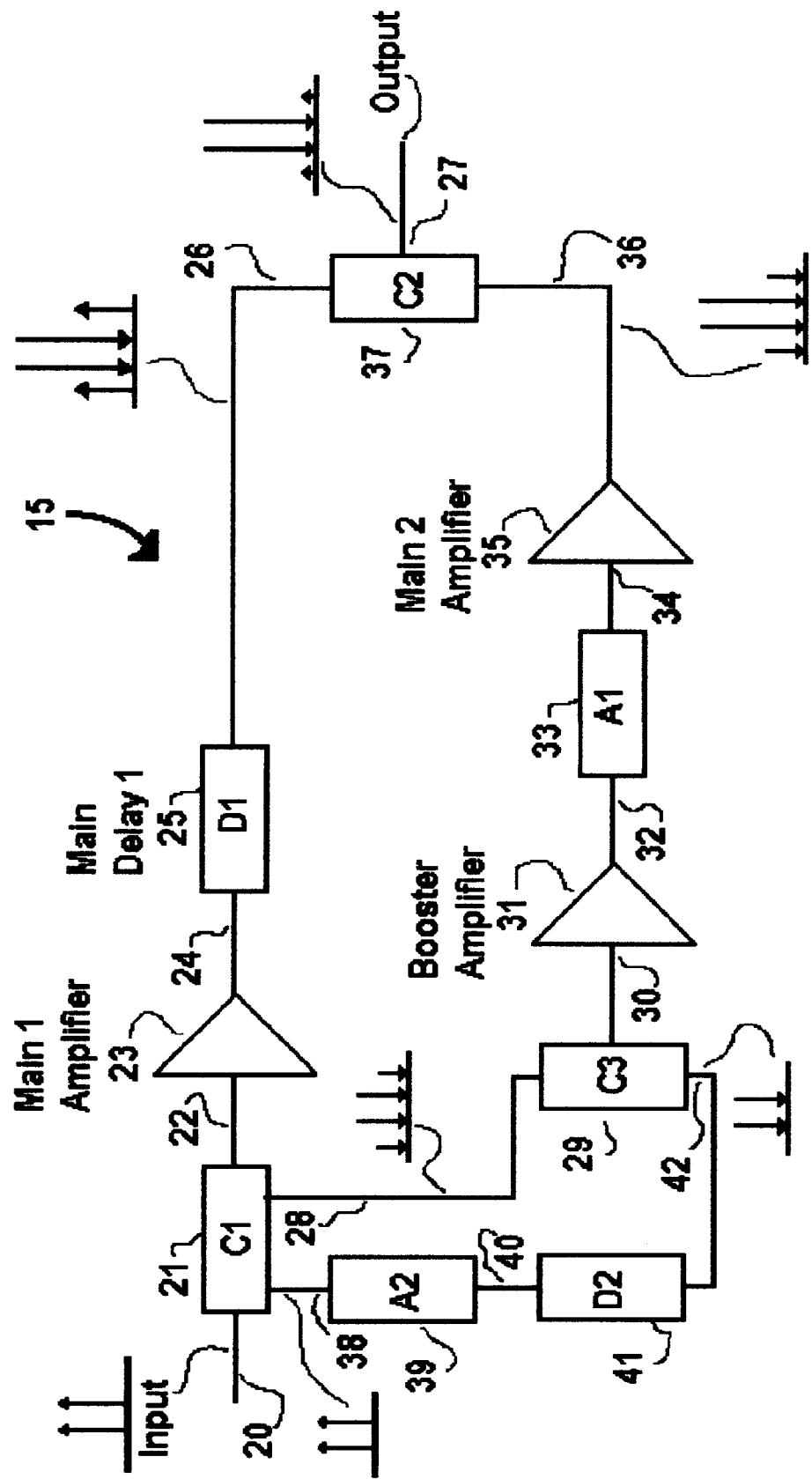

FIG. 1. Reflect Forward Adaptive Linearizer Amplifier (RFAL Amplifier) block diagram.

FIG. 2. Predistortion Amplifier Block Diagram.

FIG. 3. Feedforward Amplifier Block Diagram.

Figure 4:
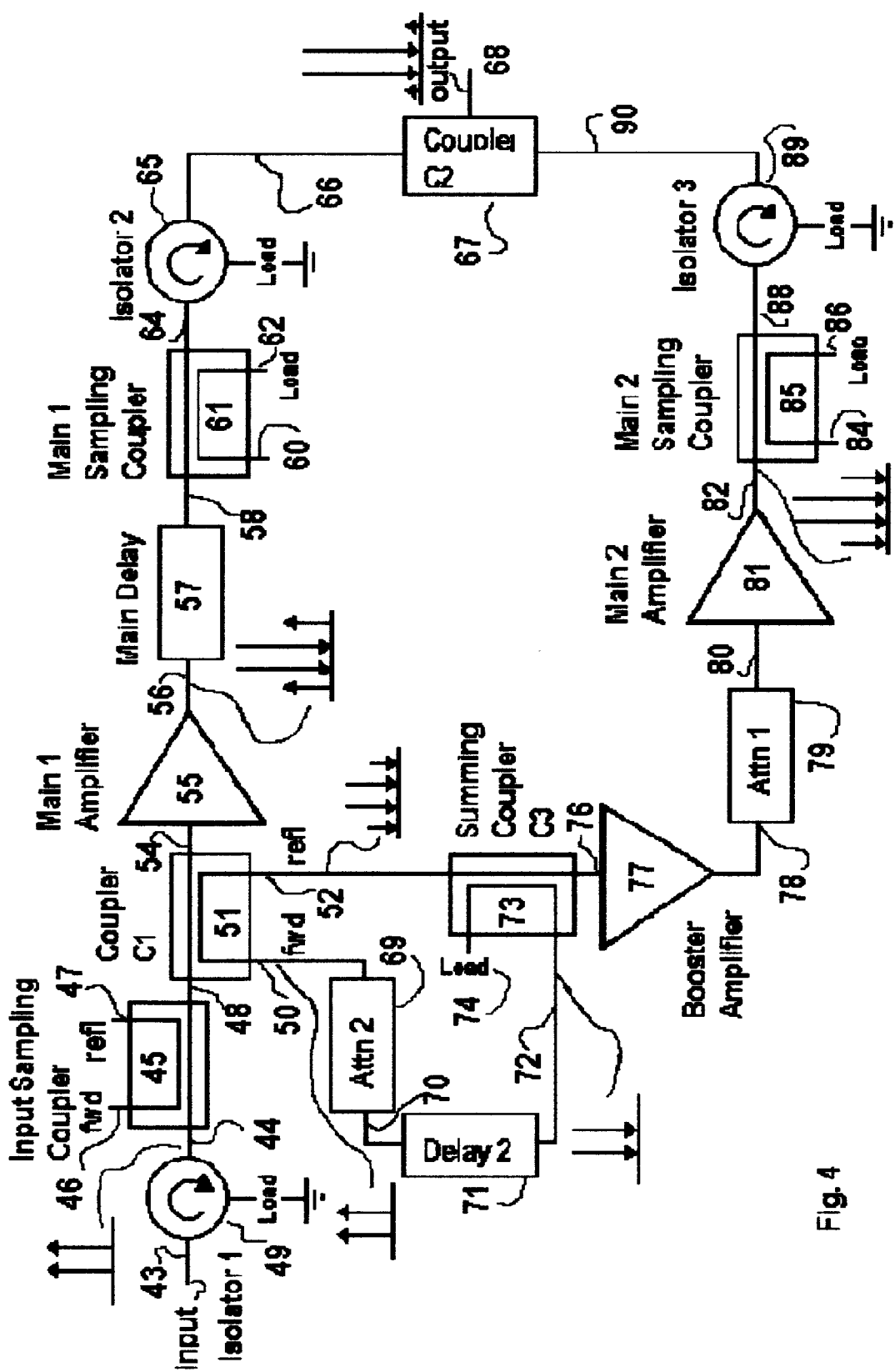

FIG. 4. "RFAL" Amplifier Prototype Assembly Block Diagram.

Figure 5:
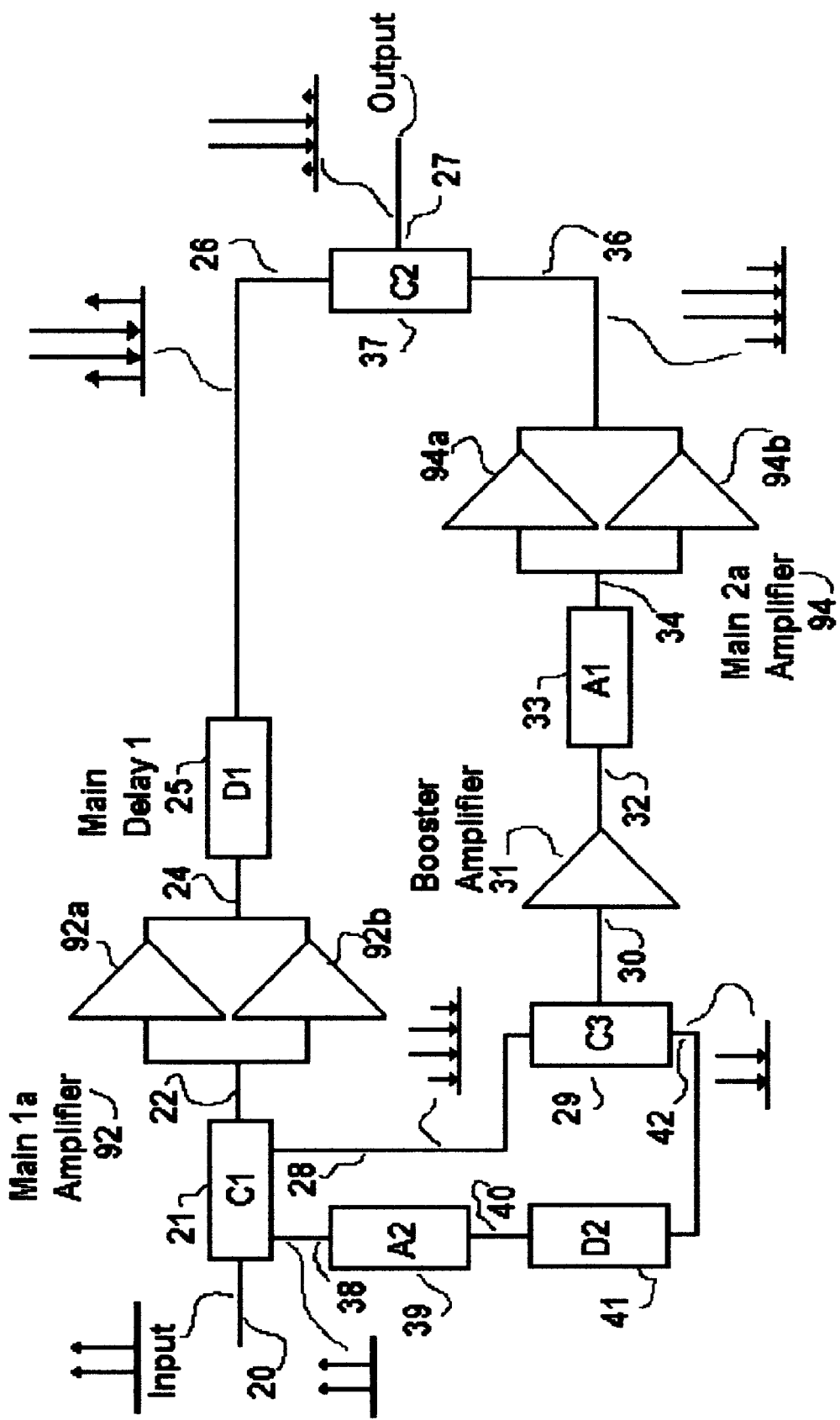

FIG. 5. Alternative Embodiment of the "RFAL" Amplifier.

REFERENCE NUMERALS IN DRAWINGS

15 Reflect Forward Adaptive Linearizer Amplifier Assembly.
20 Input to coupler C1.
21 Coupler C1.
22 Output of C1 to input of Main Amplifier 1.
23 Main Amplifier 1.
24 Output of Main Amplifier 1 to input of D1 (Main Delay 1).
25 D1 (Main Delay 1).
26 D1 (Main Delay 1) output to coupler C2 ($1^{st}$ combining port).
27 Output of Assembly (C2 common port).
28 Reflect Port of C1 to C3 coupler's thru-input.
29 C3 Coupler.
30 C3 output port to input of Booster Amplifier.
31 Booster Amplifier.
32 Output of Booster Amplifier to input of A1 (Attenuator/Phase Shifter).
33 A1 (Attenuator/Phase Shifter).
34 Output of A1 (Attenuator/Phase Shifter) to input of Main 2 Amplifier.
35 Main 2 Amplifier.
36 Output of Main 2 Amplifier to coupler C2 ($2^{nd}$ combining port).
37 Coupler C2.
38 Forward port of C1 to A2 (Attenuator).
39 A2 (Attenuator).
40 Output of A2 (Attenuator) to input of D2 (Delay).
41 D2 Delay.
42 Output of D2 to C3 coupler (coupled sum port.)
43 Input to Isolator 1. (FIG. 4)
44 Isolator 1 Output to Input Sampling Coupler.
45 Input Sampling Coupler. (FIG. 4)
46 Forward Port of "Input Sampling Coupler".
47 Reflect Port of "Input Sampling Coupler".
48 Output of "Input Sampling Coupler" to input of C1 coupler.
49 Isolator 1 (FIG. 4.)
50 Forward port of C1 Coupler.
51 C1 Coupler. (FIG. 4)
52 Reflected port of C1 Coupler.
54 Output of C1 coupler to input of Main 1 Amplifier.
55 Main 1 Amplifier. (FIG. 4)
56 Output of Main 1 Amplifier to input of Main Delay.
57 Main Delay. (FIG. 4)
58 Output of Main Delay to "Main 1 Sampling Coupler"
60 Forward port of "Main 1 Sampling Coupler".
61 "Main 1 Sampling Coupler" (FIG. 4)

62 Load (50 ohm) for "Main Sampling Coupler" reflect port.
64 Output of "Main Sampling Coupler" to input of Isolator 2.
65 Isolator 2. (FIG. 4)
66 Output of Isolator 2 to Coupler C2 ($1^{st}$ combining port)
67 Combining Coupler C2 (FIG. 4)
68 Output of Assembly (Coupler 2 common port)
69 Attenuator 2 (forward path) (FIG. 4)
70 Output of Attenuator 2 to Delay 2.
71 Delay 2 (forward path) (FIG. 4)
72 Output of Delay 2 to Coupler C3 (coupled sum port.)
73 C3 Coupler (Summing Coupler) (FIG. 4)
74 Load (50 ohm) for Coupler C3 forward port
76 Output of C3 to input of Booster Amplifier.
77 Booster Amplifier. (FIG. 4)
78 Output of Booster Amplifier to input of Attenuator 1.
79 Attenuator 1 (FIG. 4)
80 Output of Attenuator 1 to input to Main2 Amplifier.
81 Main 2 Amplifier. (FIG. 4)
82 Output of Main 2 Amplifier to input of Main 2 Sampling Coupler.
84 Forward port of Main 2 Sampling Coupler.
85 Main 2 Sampling Coupler. (FIG. 4)
86 Load (50 ohm) for Main 2 Sampling Coupler reverse port.
88 Output of Main 2 Sampling Coupler to input of Isolator 3.
89 Isolator 3 (FIG. 4)
90 Output of Isolator 3 to Coupler C2 ($2^{nd}$ combining port.)
92 Main 1a (Parallel combination of amplifiers 92a and 92b) (FIG. 5)
Main 2a (Parallel combination of amplifiers 94a and 94b) (FIG. 5)

DESCRIPTION OF FIG. 1 AND FIG. 4—Preferred Embodiment

A preferred embodiment of the Reflect Forward Adaptive Linearizer Amplifier Assembly (RFAL Amplifier) is illustrated in FIG. 1 and FIG. 4.

FIG. 1 is a simplified version of the FIG. 4. configuration used in the first prototype unit. Included are optional components provided for sampling the signals at the various path of the assembly to simplify electrical alignment and measure performance improvements with and without the distortion-cancellation technique used in the RFAL Amplifier. The optional components were: Isolators 1,2 and 3 (49, 65, 89 respectively). Input, Main1 and Main 2 "signal Sampling Couplers" (45, 61, 85 respectively). The "RFAL" Amplifier uses three basic independently adjusted paths (A, B, C) that start from the input of the assembly 15 and combine at the output 27 of the assembly 15.

A) Main 1 Amplifier path: (FIG. 1)
Input-20 connects to a coupler-21 (C1), to input-22 of a Main 1 Amplifier-23, to output-24 of Main1 Amplifier, to input of a Main Delay-25, connecting to $1^{st}$ combining port of a coupler-37 (C2) at 26, to common port at 27 also the output of assembly-15.
The coupler-21 (C1) should be a directional coupler type to keep the forward and reflected signals substantially independent. The coupling level of C1 selected depends on the level of the reflection signal and the amount of the distortion-correcting path gain that is used. Preferably the coupling value should be as high as possible to reduce C1 thru-loss. (10 dB to as low as 5 dB) Main 1 Amplifier-23 is a single stage amplifier tuned with good output flatness and preferably substantially flat return loss over the desired operating band. The Main 1 Amplifier-23 sets the limit for the RFAL Amplifier output power level of the assembly-15; therefore, it has to be selected carefully. Main Delay 1 should be a good quality transmission line with low losses. (Losses accumulated after Main 1 Amplifier-23 reduces the output power level of the assembly-15.) The length of the delay should be the minimum required to compensate for the delay in the reflected signal distortion correction path. A variable air line helps to achieve the correct length faster. Coupler-37 (C2) can be any kind of 3-dB low loss combiner. A 3-dB in-phase Wilkinson combiner is a good selection. Combiners with other phase shifts need to be accounted in the circuit with additional delay line electrical length.

B) Reflected Distortion-Cancellation path
Signal reflected at the input-22 of Main 1 Amplifier-23 will be sampled at coupler-21 (C1) and will exit C1 at port 28 connecting to thru-port of coupler-29 (C3). The thru port of the output of C3 coupler connects to the input-30 of a Booster Amplifier-31. The output of the Booster Amplifier connects to 33 a variable Attenuator/Phase adjust component A1 at 32 to provide the proper level and phasing of the signals for optimum distortion cancellation at output-27. (The A1 element can also be modified to provide temperature compensation for the assembly.) The A1 output connects to the input of a Main 2 Amplifier-35. The output of the Main 2 Amplifier connects to 36, the $2^{nd}$ combining port of coupler-37 (C2). In the preferred embodiment, the Booster Amplifier-31, and Main 2 Amplifier-35, can be the same type of amplifier as the Main 1 Amplifier-23. The use of three of the same amplifiers simplifies manufacturing, alignment time and costs. (Booster amplifier should be very linear over the operating power level range.)

C) Forward path
Input signals at 20 will be sampled by coupler-21 (C1) at the coupling port-38. The signal flows through a variable attenuator-39 (A2), connecting at 40, then through a variable delay-41 (D2). The output of D2 connects to C3 coupled sum port at 42 and continues with the same path as the reflected distortion-cancellation path from 30 to 27. The components A2 and D2 are adjusted to provide the additional level of signal required for Main 2 Amplifier to have equal output to the Main 1 Amplifier. This provides approximately double the Main 1 Amplifier power at the output of the assembly.

FIG. 5—Alternative Embodiment
FIG. 5 is an alternative embodiment consisting of amplifiers in parallel to increase the power capability of the assembly-15 in FIG. 1. (Two or more amplifiers can be used in parallel to increase the output power.)

The amplifiers can also consist of Push-Pull configuration, Cascode, Distributed etc. Multistage amplifiers can be used, however, the linearization capabilities will be limited because the distortion-cancellation signal will be a reflection of the first stage and not the output stage. (The output stage is normally the most non-linear stage in a well-designed multistage power amplifier.) In the case of multistage amplifier with a FIG. 5 configuration the assembly may act more similar to a predistortion type with limited cancellation capability over a narrower input signal level range.

Operation of the Invention

FIG. 1 shows a perspective view of the basic version of the Reflect Forward Adaptive Linearizer Amplifier Assembly ("RFAL" Amplifier). The Main 1 Amplifier-23 can be a single stage amplifier as in FIG. 1, or a plurality of single stage amplifiers in parallel connection as shown on FIG. 5 at reference 92. The amplifier and signals depicted in the figures are for a two-tone (f1 and f2) fundamental input signals, generating $3^{rd}$ order products of the (2f1-f2) and (2f2-f1) type distortion. The invention is equally applicable to a plurality of input tones or modulation schemes as used in signals for wireless telecommunication applications similar to CDMA (Code Division Multiple Access). Two-tone signals shown in the figures provide a very rough magnitude and phasing of the signals at various points in the circuit. The arrows indicate the phasing as 0 degree "arrow up" and 180 degree "arrow down".

In FIG. 1, when input signals at 20 drive an amplifier-23 using a high performance power semiconductor, a reflected signal as shown at 28, is generated at its input 22 that contains the fundamental input frequencies and also the undesired distortion products that are seen at its output 24.

After these signals are sampled at coupler-21 (C1), amplified and delayed through the single stage Booster-31, and single stage Main 2 Amplifier-35, then added at the output combiner-37, the fundamental signal from both paths of the combiner 37 will be in-phase and add, while the intermods will be out-of-phase and subtract. See FIG. 1 for the vector representation of the signals as they flow through the circuitry. (Arrow up is 0 degree, arrow down is –180 degrees).

The input reflected signal has an intermod ratio to the output intermods that track properly to close to the Pout at 1 dB gain compression point of the amplifier, and can be used to achieve a significant improvement over feedforward amplifier configurations over the full input range and in particular over the non-linear portion of the amplifier's output range.

The RFAL Amplifier significantly improves the problem that typical feedforward configurations have when they tend to loose loop balance as they reach the gain compression region. Particularly during high peak-to-average signal conditions that saturates the main and error amplifier. The non-linearity created feeds new intermods back into the final output of the assembly.

Typically the level of the input Return Loss reflection for a single stage power amplifier is in the order of 8 to 15 dB, and is relatively flat within the narrow frequency ranges as encountered in wireless telecommunications bands. The input Return Loss flatness of the Main 1 Amplifier-23 is important. The input reflected fundamental signal at 28 and its intermodulation components need to be amplified to the same output intermod level of the Main 1 Amplifier-23 to cancel the intermods from both Main Amplifiers (23 and 35) at the output of (C2) combiner-37.

The shape of the input reflected signal VS frequency is usually the inverse of the gain. Amplification of the reflected signal provides a flatness-correcting feature at the frequency band edge limits of the amplifier assembly-15.

The forward and reflected signals are sampled at the ports 38 and 28 of the C1 coupler (FIG. 1). The fundamental input signal is sampled at port 38, and is attenuated in 39, delayed in 41, to invert it 180 degrees. The forward sampled signal meets the fundamental portion of the reflected input signal from the amplifier at the proper arrival time when is summed in coupler-29 (C3) in FIG. 1.

The correcting signal formed at 30 contains the intermod products in anti-phase to the Main 1 Amplifier-23 output and also a residual in-phase level of the reflected fundamental from port 28. The level of the residual reflected fundamental signal depends on the magnitude of the reflection level of the Main 1 Amplifier-23 and the coupling value of C1. The intermods found in the correcting signal from port 28 are phase and magnitude aligned through the distortion-correcting path from port 28 through port 36 and common output 27 to cancel the output intermods. On the forward path at 38, the attenuator-39, and delay-41 are adjusted for amplitude and phase to provide the additional amount of signal to drive the Main 2 Amplifier-35 to the same fundamental in-phase amplitude level found at $1^{st}$ combiner port-26 in the Main 1 Amplifier-23 signal path. The output signals are summed in combiner-37 to maximize the desired fundamental power and cancel the intermodulation products of both Main amplifiers (23 and 35).

The selection of coupler values, and Booster Amplifier-31 gain, depends on the level of reflection from the particular Main 1 Amplifier-23 used. A very low, Main 1 Amplifier-23 input reflection, requires the Booster Amplifier-31 to have more gain, or the coupling value of Coupler 1 (21) in FIG. 1, needs to be lower, to achieve the right level of intermodulation cancellation at 27. The type of intermodulation level will also depend on the transistor technology, type and class of DC bias conditions, and other factors.

CONCLUSION, RAMIFICATION, AND SCOPE OF INVENTION

The Reflect Forward Adaptive Linearizer (RFAL) Amplifier invention can be used to provide significant adaptive linearization of the signal distortion created by a non-linear Main 1 Amplifier up to its 1 dB compression point. Furthermore, additional advantages are:

Provides two times the output power of the Main 1 Amplifier.

Real time adaptive linearization over a wide input power range. Can work with any input signal format. (Multitone, modulation, etc.)

It permits independent alignment of the three signal paths used in the RFAL Amplifier making it more economical and faster to manufacture.

Use of same type of amplifiers, simplify the construction of the piece parts and makes it easier to provide temperature and aging compensation.

Provides gain flatness compensation at the frequency band edges.

Correcting signals are sampled at the input of the amplifier and not the output. Therefore, output sampling coupler after Main Amplifier is not needed, resulting in lower losses. Shorter electrical delay line length at the output of the circuit increases the output power and efficiency of the assembly.

The method described for the RFAL amplifier can also be applicable to any device in place of the amplifier positioned in FIG. 1 item 23, FIG. 4 item 55, or FIG. 5 item 92, that has a reflective signal that includes the output non-linearity's.

It is understood that the embodiments described herein are merely exemplary and that persons skilled in the art can make modifications and variations without departing from the scope of the invention. Thus the scope of the invention should be determined by the appended claims and their legal equivalents, rather than by the examples given.

What is claimed is:

1. A linearizing method that uses of a faction of the reflected input signal of an amplifier by means of a distortion-correcting path for the purpose of reducing the output distortion products created by said amplifier; the delayed output signal of said amplifier and the output signal of said distortion-correcting path are combined to provide significant distortion reduction and increased fundamental power at the common port of an output combiner;

an amplifier assembly using said linearizing method comprising:

an input signal from at least one fundamental frequency fed to a first coupler for sampling forward and reflected input signals from a first amplifier; the reflected input signal containing a portion of the fundamental and distortion products substantially proportional to the output distortion products from said first amplifier;

a main fundamental signal path from the input of the first coupler, to said first amplifier, with the output of the first said amplifier amplifying the fundamental signal and creating output distortion products that flows through a main delay line, and first combining port of a second coupler and common output port of the said amplifier assembly;

a distortion-correcting path from said first coupler's reflected port, sampling the said reflected input signal, and feeding the port of a summing coupler, connecting to a second amplifier, a first attenuator/phase element, and a third amplifier; the second combining port of said second coupler and common output port of the said amplifier assembly;

said distortion-correcting path with a total gain sufficient to provide substantial subtraction of distortion products and summation of the fundamental reflected signal at said second coupler common output port of the said amplifier assembly;

said main delay line in the said main fundamental path with the electrical length adjusted to substantially cause the distortion to subtract, and the fundamental signals to add, at the said second coupler common output port of the said amplifier assembly;

a forward fundamental signal path from said first coupler forward port connecting to a second attenuator, a second delay line, feeding the port of the said summing coupler;

said second attenuator and second delay line, providing proper attenuation and electrical length to set the composite fundamental input signal to the said third amplifier to a level substantially close to the said first amplifier in the preferred embodiment;

whereby the signal level at the said second coupler common output port of the assembly will be substantially a level two times the output of the first amplifier and the distortion products will be substantially reduced.

2. The amplifier assembly of claim 1 wherein said first amplifier consists of a single stage amplifier.

3. The amplifier assembly of claim 1 wherein said first amplifier consists of a plurality of amplifiers connected in parallel.

4. The amplifier assembly of claim 1 wherein said first amplifier is replaced by another type of non-linear device.

* * * * *